(12) United States Patent
Abdo et al.

(10) Patent No.: US 10,813,219 B2
(45) Date of Patent: Oct. 20, 2020

(54) INTEGRATING JOSEPHSON AMPLIFIERS OR JOSEPHSON MIXERS INTO PRINTED CIRCUIT BOARDS

(71) Applicant: INTERNATIONAL BUSINESS MACHINES CORPORATION, Armonk, NY (US)

(72) Inventors: Baleegh Abdo, Fishkill, NY (US); Nicholas T. Bronn, Long Island City, NY (US); Oblesh Jinka, Stamford, CA (US); Salvatore B. Olivadese, Stamford, CT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/511,071

(22) Filed: Jul. 15, 2019

(65) Prior Publication Data

US 2019/0343003 A1 Nov. 7, 2019

Related U.S. Application Data

(63) Continuation of application No. 15/720,665, filed on Sep. 29, 2017, now Pat. No. 10,398,031.

(51) Int. Cl.
*G06N 99/00* (2019.01)
*G01R 33/02* (2006.01)
(Continued)

(52) U.S. Cl.
CPC ............. *H05K 1/183* (2013.01); *G06N 10/00* (2019.01); *H01L 39/045* (2013.01); *H03D 7/005* (2013.01);
(Continued)

(58) Field of Classification Search
CPC ........ G06N 99/00; G01R 33/02; H01L 39/04; H01L 39/22; H01L 39/24
(Continued)

(56) References Cited

U.S. PATENT DOCUMENTS 4,551,747 A * 11/1985 Gilbert ................. H01L 23/057
257/691
5,014,160 A  5/1991 McCoy
(Continued)

FOREIGN PATENT DOCUMENTS

EP 0595346 A1 5/1994

OTHER PUBLICATIONS

Abdo et al, "Integrating Josephson Amplifiers or Josephson Mixers Into Printed Circuit Boards", U.S. Appl. No. 16/511,068, filed Jul. 15, 2019.
(Continued)

*Primary Examiner* — Xiaoliang Chen
(74) *Attorney, Agent, or Firm* — Cantor Colburn LLP; Keivan Razavi (57) ABSTRACT

An aspect includes one or more board layers. A first chip cavity is formed within the one or more board layers, wherein a first Josephson amplifier or Josephson mixer is disposed within the first chip cavity. The first Josephson amplifier or Josephson mixer comprises at least one port, each port connected to at least one connector disposed on at least one of the one or more board layers, wherein at least one of the one or more board layers comprises a circuit trace formed on the at least one of the one or more board layers.

5 Claims, 6 Drawing Sheets

(51) Int. Cl.

| | |
|---|---|
| *H01L 39/04* | (2006.01) |
| *H01L 39/22* | (2006.01) |
| *H01L 39/24* | (2006.01) |
| *H05K 1/18* | (2006.01) |
| *G06N 10/00* | (2019.01) |
| *H05K 1/02* | (2006.01) |
| *H03D 7/00* | (2006.01) |
| *H03F 19/00* | (2006.01) |
| *H05K 1/11* | (2006.01) |
| *H05K 3/30* | (2006.01) |
| *H05K 3/40* | (2006.01) |
| *H05K 3/46* | (2006.01) |
| *H05K 3/00* | (2006.01) |

(52) U.S. Cl.
CPC ........... *H03F 19/00* (2013.01); *H05K 1/0243* (2013.01); *H05K 1/0298* (2013.01); *H05K 1/115* (2013.01); *H05K 1/185* (2013.01); *H05K 3/30* (2013.01); *H05K 3/4038* (2013.01); *H05K 1/0216* (2013.01); *H05K 3/0011* (2013.01); *H05K 3/4697* (2013.01); *H05K 2201/1056* (2013.01); *H05K 2201/10371* (2013.01)

(58) Field of Classification Search
USPC ......... 361/761; 257/691, 700, 703; 324/248, 324/602; 1/1
See application file for complete search history.

(56) References Cited

U.S. PATENT DOCUMENTS

| | | | | |
|---|---|---|---|---|
| 5,493,719 A * | 2/1996 | Smith | ................... | H01Q 1/364 455/319 |
| 8,933,695 B1 * | 1/2015 | Kornev | .............. | G01R 33/0354 324/248 |
| 9,057,853 B2 * | 6/2015 | Lau | .......................... | G02B 6/43 |
| 9,691,962 B2 | 6/2017 | Abdo | | |
| 9,836,699 B1 * | 12/2017 | Rigetti | .................. | H01L 39/223 |
| 9,971,970 B1 * | 5/2018 | Rigetti | .................... | H01L 27/18 |
| 10,068,184 B1 * | 9/2018 | Hertzberg | ............. | H01L 39/025 |
| 10,074,793 B2 * | 9/2018 | Abdo | ..................... | G06N 10/00 |
| 2002/0171141 A1 | 11/2002 | Anmar | | |
| 2003/0174095 A1 * | 9/2003 | Sievenpiper | ........... | H01Q 13/10 343/770 |
| 2006/0160500 A1 | 7/2006 | Anmar | | |
| 2007/0194225 A1 * | 8/2007 | Zorn | ..................... | G01O 60/12 250/306 |
| 2009/0099025 A1 | 4/2009 | Uchaykin | | |
| 2010/0215314 A1 * | 8/2010 | Lau | .......................... | G02B 6/43 385/14 |
| 2014/0232483 A1 * | 8/2014 | Correa | .................... | H03F 3/602 333/136 |
| 2015/0241481 A1 * | 8/2015 | Narla | ...................... | H03F 19/00 324/602 |
| 2016/0267032 A1 * | 9/2016 | Rigetti | ................ | G06F 13/4068 |
| 2016/0294340 A1 * | 10/2016 | Goel | ....................... | H01L 25/50 |
| 2016/0308502 A1 * | 10/2016 | Abdo | ........................ | H03F 7/04 |
| 2016/0364653 A1 * | 12/2016 | Chow | ...................... | H01L 39/223 |
| 2016/0380636 A1 * | 12/2016 | Abdo | ....................... | H01P 5/103 326/3 |
| 2017/0039481 A1 * | 2/2017 | Abdo | .................... | H01L 39/025 |
| 2017/0085231 A1 * | 3/2017 | Abdo | ........................ | H03F 1/42 |
| 2017/0091646 A1 * | 3/2017 | Abdo | ........................ | H01P 1/38 |
| 2017/0092833 A1 * | 3/2017 | Abdo | ........................ | H01P 5/184 |
| 2017/0229632 A1 * | 8/2017 | Abdo | ................. | H01L 39/2493 |
| 2017/0229633 A1 * | 8/2017 | Abdo | .................... | H03K 17/92 |
| 2018/0070404 A1 * | 3/2018 | Giguet | ............. | H04W 52/0216 |
| 2018/0247974 A1 * | 8/2018 | Oliver | .................... | G06N 10/00 |
| 2019/0104614 A1 | 4/2019 | Abdo et al. | | |

OTHER PUBLICATIONS

International Search Report and Written Opinion for PCT/EP2017/081162 dated May 28, 2018; 14 pages.

List of IBM Patents or Patent Applications Treated as Related; (Appendix P), Filed Jul. 15, 2019; 2 pages.

* cited by examiner

INTEGRATING JOSEPHSON AMPLIFIERS OR JOSEPHSON MIXERS INTO PRINTED CIRCUIT BOARDS

DOMESTIC PRIORITY

The present application claims priority to U.S. Nonprovisional application Ser. No. 15/720,665 filed on Sep. 29, 2017, titled "INTEGRATING JOSEPHSON AMPLIFIERS OR JOSEPHSON MIXERS INTO PRINTED CIRCUIT BOARDS," assigned to the assignee hereof and expressly incorporated by reference herein.

BACKGROUND

The present invention generally relates to superconducting devices. More specifically, the present invention is directed to integrating Josephson amplifiers or Josephson mixers into printed circuit boards.

Superconducting quantum computing is an implementation of a quantum computer in superconducting electronic circuits. Quantum computation studies the application of quantum phenomena for information processing and communication. Various models of quantum computation exist, and the most popular models incorporate the concepts of qubits and quantum gates. A qubit is a generalization of a bit that has two possible states, but can be in a quantum superposition of both states. A quantum gate is a generalization of a logic gate, however the quantum gate describes the transformation that one or more qubits will experience after the gate is applied on them, given their initial state.

The electromagnetic energy associated with the qubit can be stored in so-called Josephson junctions and in the capacitive and inductive elements that are used to form the qubit. In one example, to read out the qubit state, a microwave signal is applied to the microwave readout cavity that couples to the qubit at the cavity frequency. The transmitted (or reflected) microwave signal goes through multiple thermal isolation stages and low-noise amplifiers that are required to block or reduce the noise and improve the signal-to-noise ratio. The microwave signal is measured at room temperature. The amplitude and/or phase of the returned/output microwave signal carry information about the qubit state, such as whether the qubit is at the ground or excited states or at a superposition of the two states. The microwave signal carrying the quantum information about the qubit state is usually weak on the order of a few microwave photons. To measure this weak signal with room temperature electronics, low-noise Josephson amplifiers are usually used as preamplifiers (first amplification stage) at the output of the quantum system to boost the quantum signal and improve the signal to noise ratio of the output chain. In addition to Josephson amplifiers, certain Josephson microwave components that employ Josephson amplifiers or Josephson mixers such as Josephson circulators, Josephson isolators, and Josephson mixers are expected to play a crucial role in scalable quantum processors and quantum communication.

Josephson parametric amplifiers are high-gain, low-noise amplifiers that are used in the readout of qubits and the measurement of quantum systems.

A Josephson ring modulator (JRM) is a nonlinear dispersive element based on Josephson tunnel junctions that can perform three-wave mixing of microwave signals at the quantum limit. The JRM consists of Josephson Junctions (JJs). In order to construct a non-degenerate parametric device that is the Josephson parametric converter (JPC) (which is one example of Josephson parametric amplifiers), which is capable of amplifying and/or mixing microwave signals (without amplification) at the quantum limit, the JRM is coupled to two different microwave resonators.

SUMMARY

Embodiments of the present invention are directed to printed circuit boards. A non-limiting example of the printed circuit board includes one or more board layers. A first chip cavity is formed within the one or more board layers, wherein a first Josephson amplifier or Josephson mixer is disposed within the first chip cavity. The first Josephson amplifier or Josephson mixer comprises at least one port, each port connected to at least one connector disposed on at least one of the one or more board layers, wherein at least one of the one or more board layers comprises a circuit trace formed on the at least one of the one or more board layers.

Embodiments of the present invention are directed to printed circuit boards. A non-limiting example of the printed circuit board includes a dielectric substrate. A first chip cavity and a second chip cavity are formed within the dielectric substrate, wherein a first Josephson amplifier or Josephson mixer is disposed within the first chip cavity and a second Josephson amplifier or Josephson mixer is disposed within the second chip cavity. The first chip cavity and the second chip cavity can be formed utilizing any etching, removal, and/or fabrication techniques for printed circuit boards or the like known in the art. Each of the Josephson amplifiers or Josephson mixers comprise at least one port, each port electronically coupled to at least one connector and each of the at least one connector is disposed on the dielectric substrate.

Embodiments of the present invention are directed to printed circuit boards. A non-limiting example of the printed circuit board includes one or more board layers. A first chip cavity and a second chip cavity are formed within the one or more board layers, wherein a first Josephson amplifier or Josephson mixer is disposed within the first chip cavity and a second Josephson amplifier or Josephson mixer is disposed within the second chip cavity. A coupler is disposed on at least one of the one or more board layers, wherein the coupler comprises a first leg and a second leg and the first leg is electronically coupled to the first Josephson amplifier or Josephson mixer and the second leg is electronically coupled to the second Josephson amplifier or Josephson mixer.

Embodiments of the present invention are directed to integrating Josephson amplifiers or Josephson mixers into printed circuit boards. A non-limiting example of the method of integrating Josephson amplifiers or Josephson mixers into printed circuit boards includes providing one or more board layers. Forming a first chip cavity within the one or more board layers, wherein the first chip cavity is operable to receive a Josephson amplifier or Josephson mixer. A Josephson amplifier or Josephson mixer is disposed into the first chip cavity and at least one connector is disposed on at least one of the one or more board layers.

Embodiments of the present invention are directed to integrating Josephson amplifiers or Josephson mixers into printed circuit boards. A non-limiting example of the method for integrating Josephson amplifiers or Josephson mixers into printed circuit boards includes providing a dielectric layer. A first chip cavity and a second chip cavity are formed within the dielectric substrate, wherein the first chip cavity is operable to receive a first Josephson amplifier or Josephson mixer and the second chip cavity is operable to receive a second Josephson amplifier or Josephson mixer. The first Josephson amplifier or Josephson mixer is disposed into the first chip cavity and the second Josephson amplifier or Josephson mixer is disposed into the second chip cavity. At least one connector is disposed on at least one of the one or more board layers.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

DETAILED DESCRIPTION

For the sake of brevity, conventional techniques related to semiconductor and/or superconducting devices and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor and/or superconducting devices and semiconductor/superconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, Josephson-based microwave circuits such as, for example, directional amplifiers, circulators, isolators, switches, require the integration of multiple Josephson amplifiers or Josephson mixers together. As superconducting quantum processors are scaled up, they are expected to require a large number of quantum-limited Josephson amplifiers in order to preform high-fidelity, quantum nondemolition (QND) measurements of the qubits states. Packaging these amplifiers individually in separate packages or separate cryoperm magnetic shield cans is impractical in the long run and is not possible in large quantum processors.

Turning now to an overview of the aspects of the invention, one or more embodiments of the invention address the above-described shortcomings of the prior art by providing integration of Josephson-based microwave circuits into a printed circuit board (PCB).

More specifically, the above-described aspects of the invention address the shortcomings of the prior art (such as full on-chip integration or combining discrete components in separate packages) by providing enhanced flexibility, reduced cost, increased modularity, and simplified couplings to normal-metal microwave circuits and components such as, for example, lumped-element capacitors, lumped-element inductors, and lumped-element resistors. Additionally, the integration scheme enables the placement of high-density Josephson amplifiers and/or Josephson mixers that would be needed in large-scale quantum processors. Using this integration scheme, crosstalk between various components can be controlled, reduced, or mitigated using various microwave techniques such as, for example, using vias, using different packages for different components, and routing signals through different metallic layers. Another two advantages of breaking the device into multiple chips connected through a PCB are the (1) elimination of low-frequency, chip modes associated with large size chips or large metallic packages and (2) to provide better thermalization to the fridge stage.

Figure 1:
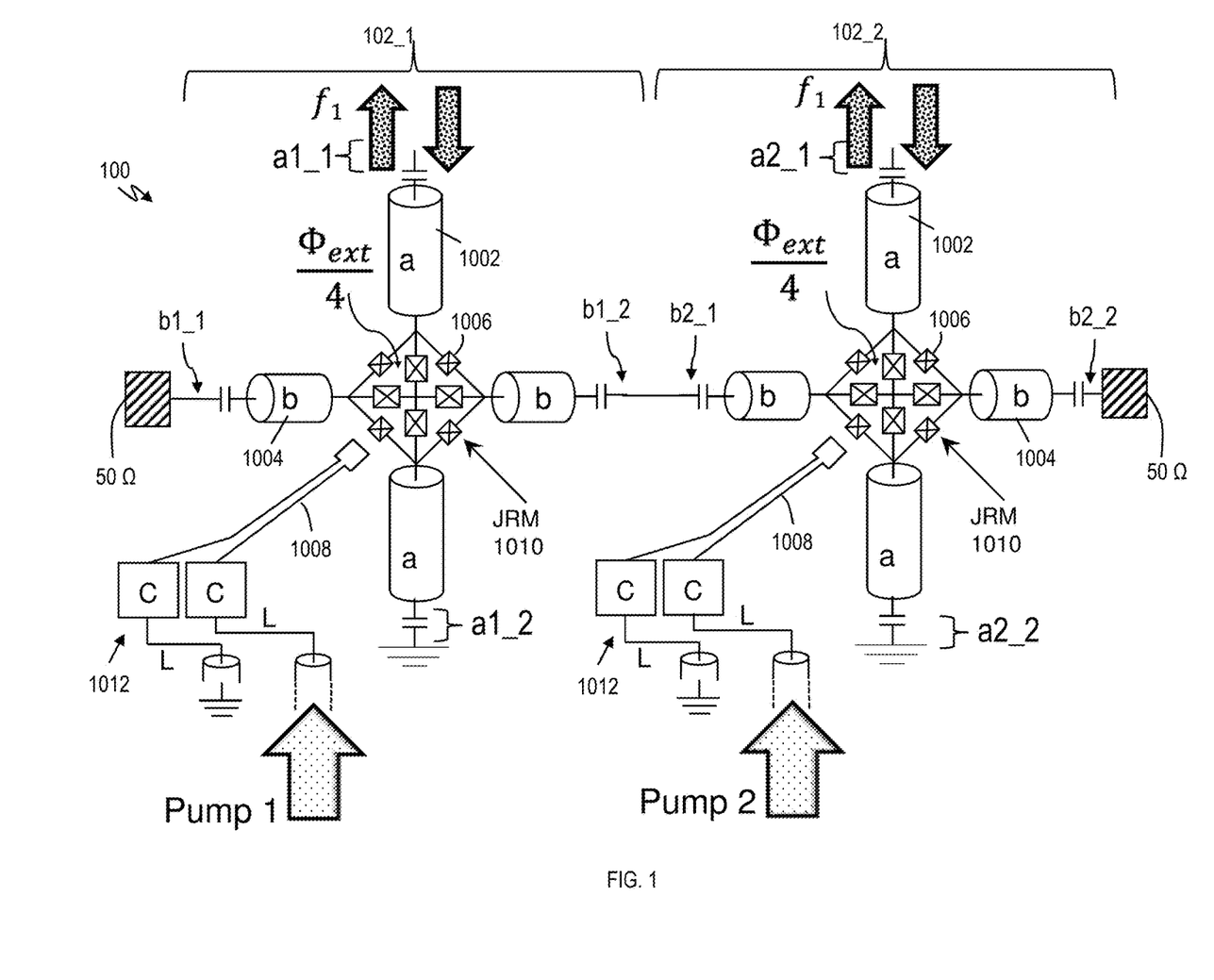
FIG. 1 depicts an example of a Josephson directional amplifier 100 without illustrating a 90° hybrid coupler according to embodiments of the present invention.

FIG. 1 depicts an example of two Josephson parametric amplifiers which work in reflection, in this case JPCs, integrated with a microwave component, i.e., a 90° hybrid coupler, to form a more sophisticated Josephson microwave device, which is in this example a Josephson directional amplifier 100. FIG. 1 showing the Josephson directional amplifier does not illustrate the 90° hybrid coupler according to embodiments of the present invention. However, it should be appreciated that the hybrid coupler 104 is connected although not shown. Each of three-wave-mixing Josephson amplifiers 102_1 and 102_2 includes a Josephson ring modulator (JRM) 1010 which is a nonlinear dispersive element based on (4) Josephson tunnel junctions 1006 in an outer ring which can perform three-wave mixing of microwave signals at the quantum limit. Particularly, the JRM 1010 consists of four nominally identical Josephson junctions arranged in a Wheatstone bridge configuration.

Figure 2:
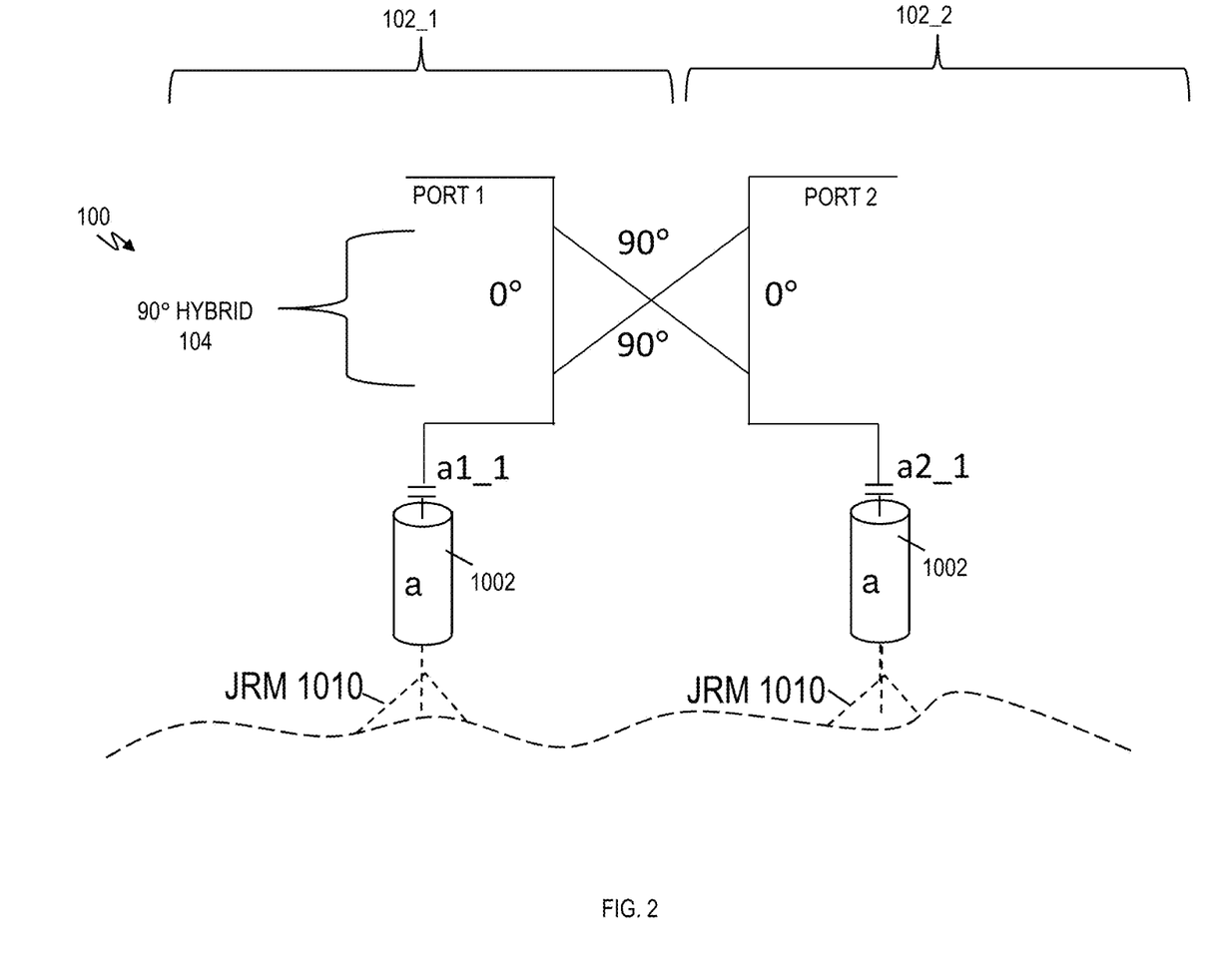
FIG. 2 depicts an example hybrid coupler according to one or more embodiments of the present invention.

In each of the three-wave-mixing Josephson amplifiers 102_1 and 1022, one of the microwave resonators is depicted as resonator_a 1002 and the other is resonator_b 1004. The resonators_a 1002 can be referred to as Signal resonators and the resonators_b 1004 can be referred to as Idler resonators. The resonators 1002 and 1004 are shown as transmission-line resonators, but the resonators 1002 and 1004 can be implemented as lumped elements, etc. In FIG. 1, the 90° hybrid coupler 104 would be connected to ports a1_1 and a2_1. For example, FIG. 2 depicts port a1_1 from Signal resonator_a 1002 of three-wave-mixing Josephson amplifier 102_1 connected to one leg of the 90° hybrid coupler 104 and port a2_1 from Signal resonator_a 1002 of three-wave-mixing Josephson amplifier 102_2 connected to the opposite leg of the 90° hybrid coupler 104. FIG. 2 is only a partial view of the Josephson directional amplifier 100 illustrating connection of the resonators 1002 to the hybrid coupler 104.

In FIG. 1, the ports b1_2 and b2_1 are electronically coupled. There are various ways of feeding the pump signals 1 and 2 to the Josephson amplifiers 102_1 and 102_2 which have equal amplitudes, the same frequency $f_p$, but have a zero or nonzero phase difference. As one example, in FIG. 1 the pumps p1 and p2 can be fed to on-chip flux lines in the form of short-circuited coupled stripline that are capacitively coupled to two adjacent nodes of the JRM 1010. Such pump lines can both support microwave tones at the pump frequency and direct current (DC) currents that flux bias the JRMs. A low-pass filter 1012 can be coupled in between the pump port and the flux line 1008 to prevent power leakage from the Signal 1002 and Idler 1004 resonators. Another way for flux biasing the JRMs is by using external magnetic coils attached to the Josephson amplifiers or Josephson mixers package and/or using a very small magnetic material integrated on chip or in the package. Another way to feed the pump drives is by using an on-chip 3-port power divider that capacitively couples to opposite nodes of the JRM 1010. Further, each resonator_a 1002 and resonator_b 1004 has two ends.

FIG. 1 shows that the one end of resonator_a 1002 is capacitively coupled to a feedline that connects to one port of the 90° hybrid 104 (a1_1 for Josephson amplifier/mixer 102_1 and a2_1 for Josephson amplifier/mixer 102_2). The other end of resonator_a 1002 is connected to a feedline that is shorted to ground (a1_2 for Josephson amplifier/mixer 102_1 and a2_2 for Josephson amplifier/mixer 102_2). One end of resonator_b 1004 (b12 for Josephson amplifier/mixer 102_1 and b2_1 for Josephson amplifier/mixer 1022) is capacitively coupled to a shared transmission line between the two resonators_b of the two Josephson amplifiers/mixers 102_1 and 102_2. The other end of resonator_b (b1_1 for Josephson amplifier/mixer 102_1 and b2_2 for Josephson amplifier/mixer 1022) is capacitively coupled to a feedline that is terminated by a 50 Ohm load.

In one or more embodiments, each mixer 102_1 and 102_1 is a Josephson parametric converter. In FIG. 1, the first Josephson parametric converter 102_1 includes a Signal resonator (e.g., resonator_a 1002) electronically coupled to the Signal port a1 and the second Josephson parametric converter 102_2 includes another Signal resonator (e.g., resonator_a 1002) electronically coupled to another Signal port a2. The first Josephson parametric converter 102_1 includes an Idler resonator (e.g., resonator_b 1004) coupled to the Idler port b1 and the second Josephson parametric converter 102_2 includes another Idler resonator (e.g., resonator_b 1004) coupled to the other Idler port b2. One leg of a hybrid coupler 104 is electronically coupled to the Signal port a1_1 and another leg of the hybrid coupler 104 is electronically coupled to the other Signal port a2_1. One port of the 90° hybrid 104 that is not directly connected to the JPC ports a1_1 and a2_1, forms port 1 of the whole device. Similarly, another port of the 90° hybrid 104 that is not directly connected to either JPC ports a1_1 and a2_1, forms port 2 of the whole device. Ports 1 and 2 carry the input and output signals of the directional Josephson amplifier. An example of a PCB-integrated Josephson directional amplifier is presented in FIG. 8.

In one or more embodiments, the Josephson amplifiers or Josephson mixers described herein can be integrated in to printed circuit boards (PCBs).

Figure 3:
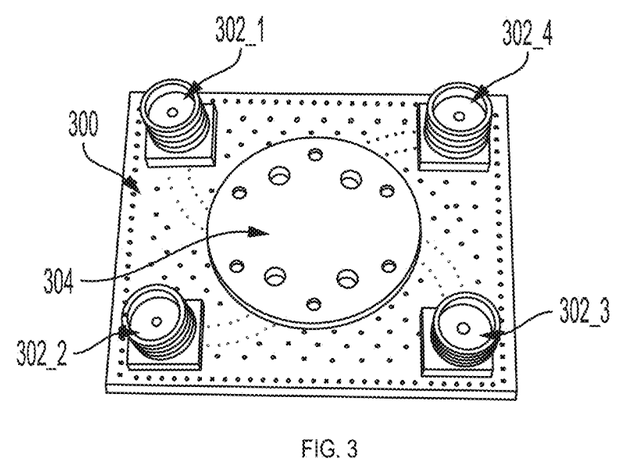
FIG. 3 depicts a top view of a Josephson amplifier or Josephson mixer integrated within a printed circuit board (PCB) according to one or more embodiments of the invention.

FIG. 3 depicts a top view of a Josephson amplifier or Josephson mixer integrated within a printed circuit board (PCB) according to one or more embodiments of the invention. As mentioned herein, electronic components can be connected to printed circuit boards (PCBs), also known as printed wiring boards (PWBs). Printed circuit board (PCB) technology generally involves forming conductive traces on an insulating substrate to effect often complex interconnections between electronic components mounted to or plugged into the PCB. PCBs having conductive traces on both sides of the board, as well as multi-layer arrangements of alternating insulating and conductive layers. Additionally, effecting connections from layer-to-layer, within the PCB, can be done through vias. It should clearly be understood that, in any of the embodiments described hereinbelow setting forth PCB substrates, these substrates can be formed of materials other than "traditional" printed circuit board materials. For example, the "PCB" substrate can be formed of one or more layers of plastic material, such as polyimide, optionally with conductive foil layers sandwiched there between.

Digital electronics and other devices, including analog devices, are mounted on printed circuit boards which are designed to be placed inside an electrical or electronic device or product. Similar to the interconnections between devices located within a chip, the various components mounted on a printed circuit board are connected by electrical pathways, typically metal interconnections known as "traces." The traces are typically thin lines of deposited conductive material, usually copper. The design and the configuration of the interconnections between the components on the printed circuit board determines the board's function. Most printed circuit boards typically contain multiple inter-connected layers. Thus, an entire circuit or "net" may be located entirely on the interior layers of a board. As a practical matter, the nets of the board almost always extend to an exterior layer.

The printed circuit board (PCB) 300 includes multiple metallic and dielectric layers as described above. The exterior (top) layer includes four connectors (302_1, 302_2, 302_3, 302_4) and a top cover 304 arranged on the exterior layer. The four connectors (302_1, 302_2, 302_3, 302_4) can be any type of connector including but not limited to SMA, SSMA, SMB, SMP, and the like. The four connectors can also be high-density connectors that connect to high-density traces on the PCB 300. The four connectors can be soldered, surface mounted, mechanically pressed, or the like. The layering and connecting of the various traces, board layers, and components can be performed by any printed circuit board assembly techniques.

Figure 4:
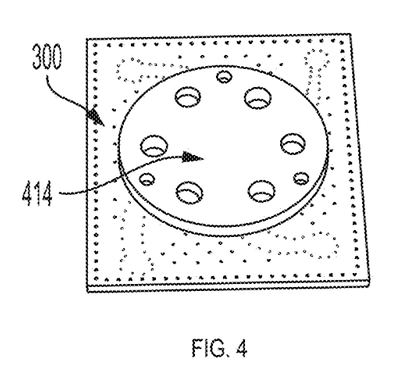
FIG. 4 depicts bottom view of a Josephson amplifier or Josephson mixer integrated within a printed circuit board (PCB) according to one or more embodiments of the invention.

FIG. 4 depicts bottom view of the Josephson amplifier or Josephson mixer integrated within a printed circuit board (PCB) according to one or more embodiments of the invention. The exterior (bottom) layer includes a bottom cover 414 arranged on the exterior layer. Both the top cover 304 and the bottom cover 414 are operable to enclose the Josephson amplifier or Josephson mixer integrated within the printed circuit board 300. The top cover 304 and bottom cover 414 can be a high-thermal-conductivity package attached to the PCB 300 such as, for example, an oxygen-free-high-conductivity (OFHC) copper and gold.

Figure 5:
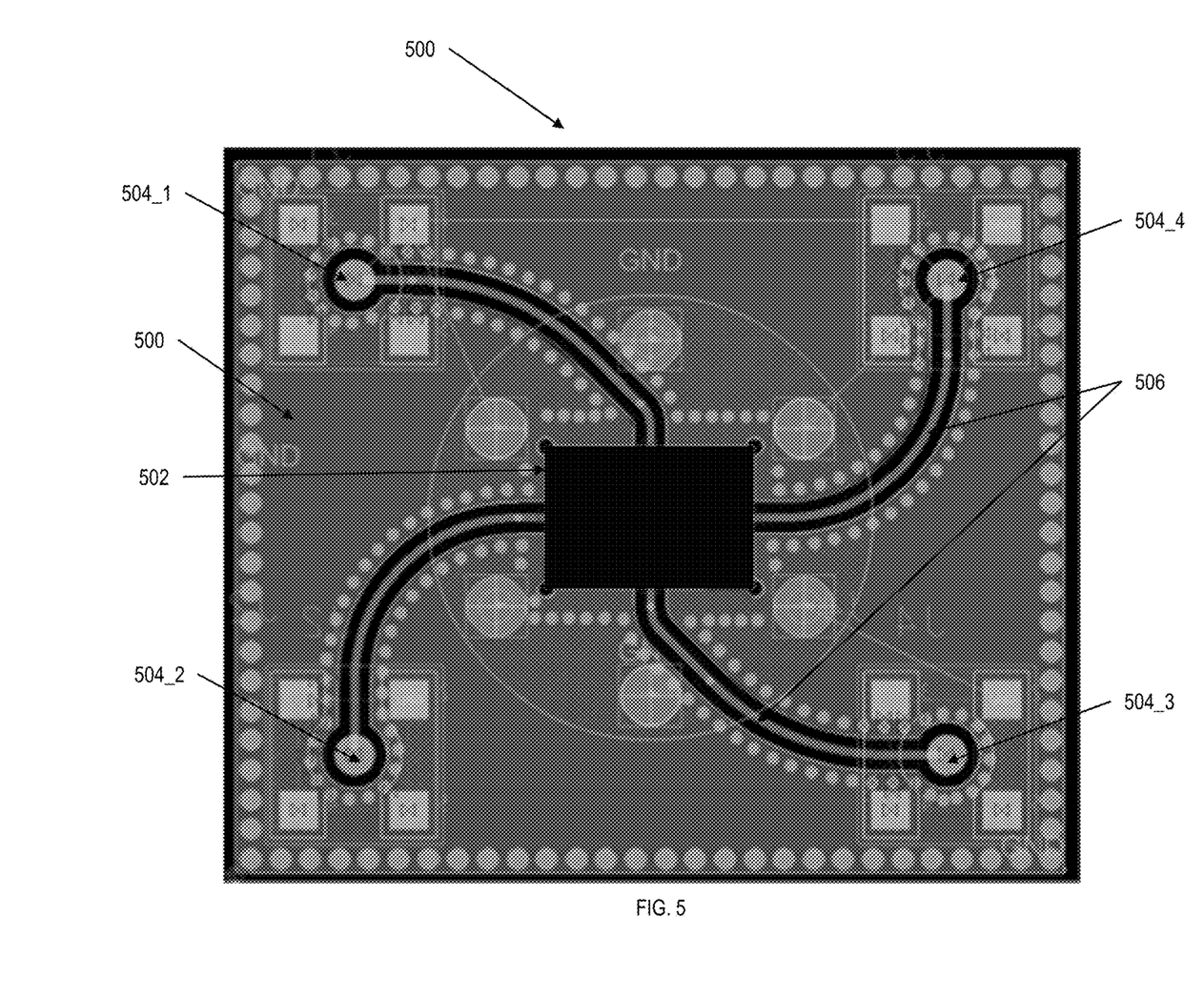
FIG. 5 depicts a buried or internal board layer of the printed circuit board (PCB) according to one or more embodiments of the present invention.

FIG. 5 depicts a buried or internal board layer of the printed circuit board according to one or more embodiments. The buried board layer 500 includes a cavity 502. The cavity 502 is operable to receive a Josephson amplifier or Josephson mixer such as the three-wave-mixing amplifiers 102_1 or 102_2 described in FIG. 1. The buried board layer 500 includes four traces 506 each terminating into the cavity 502 and at a termination point 504_1-504_4. The termination points 504_1 to 504_4 can connect to the connectors 302_1 to 302_4 from FIG. 3. The traces 506 can be wire bonded to ports a1_1, a2_2, b1_1, and b1_2 of the Josephson amplifier of 102_1 from FIG. 1. The PCB 300 can include the top layer, bottom layer, and multiple buried board layers (e.g., 500) that are connected utilizing any PCB fabrication technique. Additionally, the traces 506 of the buried board layer 500 can be connected to traces of other buried layers and/or the top and bottom layer utilizing vias. Vias are an electrical connection between layers in a physical electronic circuit that go through the plane of one or more adjacent layers.

Figure 6:
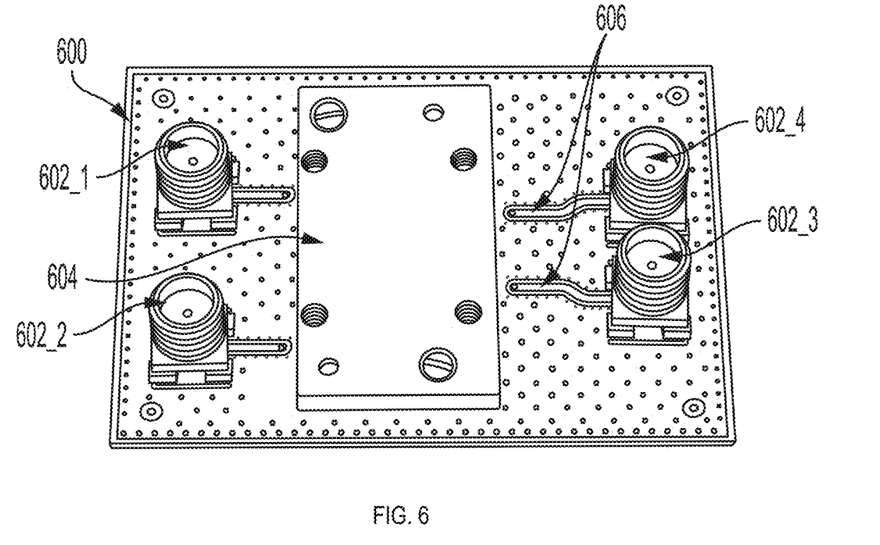
FIG. 6 depicts a top view of two Josephson amplifier or Josephson mixer integrated within a printed circuit board (PCB) according to one or more embodiments of the invention.

FIG. 6 depicts a top view of two Josephson amplifier or Josephson mixer integrated within a printed circuit board (PCB) according to one or more embodiments of the invention. The printed circuit board 600 includes multiple board layers as described above. The exterior (top) layer includes four connectors (602_1, 602_2, 602_3, 602_4) and a top cover 604 arranged on the exterior layer. The exterior layer of the PCB 600 includes traces 606 formed on the exterior layer. Used herein, "traces" can be any electronic transmission line such as, for example, striplines, microstrips, coplanar waveguides, coupled-striplines, and the like. The traces 606 on the exterior (top) layer can be connected to traces or other elements disposed on other layers of the PCB 600 utilizing vias or other transmission means.

Figure 7:
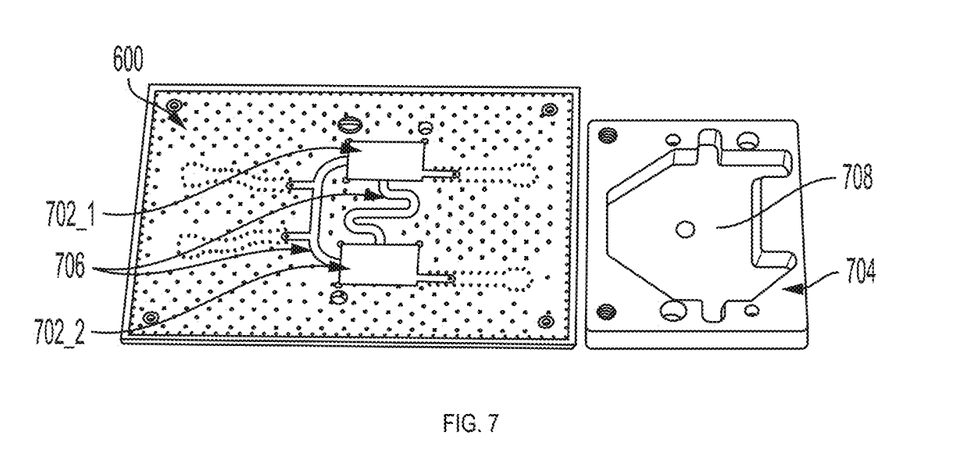
FIG. 7 depicts a bottom view of two Josephson amplifier or Josephson mixer integrated within a printed circuit board (PCB) according to one or more embodiments of the invention.

FIG. 7 depicts a bottom view of two Josephson amplifier or Josephson mixer integrated within a printed circuit board (PCB) according to one or more embodiments of the invention. The exterior (bottom) layer includes a first chip cavity 702_1 and a second chip cavity 702_2. The first chip cavity 702_1 and second chip cavity 7022 are sized and configured to receive an integrated circuit chip such as, for example, a Josephson amplifier or Josephson mixer. The exterior (bottom) layer includes multiple traces 706 that connect the first chip cavity 702_1 and the second chip cavity 702_2. In addition, the traces 706 can connect to the traces 606 on the exterior (top) layer utilizing vias. The traces 706 through the vias and traces 606 can connect the Josephson amplifiers or Josephson mixers to the connectors 602_1 to 602_4. The traces 706 can be wire bonded to ports a1_1, a22, b1_1, and b1_2 of a Josephson amplifier or Josephson mixer disposed within each of the cavities 702_1 and 702_2. The PCB also 600 includes a bottom cover 704 that can be arranged on the exterior (bottom) layer. Both the top cover 604 and the bottom cover 704 are operable to enclose the two Josephson amplifier or Josephson mixer integrated within the printed circuit board 600. The top cover 604 and bottom cover 704 can be a high-thermal-conductivity package attached to the PCB 600 such as, for example, an oxygen-free-high-conductivity (OFHC) copper and gold. The bottom cover 704 includes a cavity 708 that can enclose the two Josephson amplifiers or Josephson mixers such that the bottom cover 704 does not contact any of the traces 706. The top cover 604 provides a mounting surface for the two Josephson amplifiers or Josephson mixers. Similar to the bottom cover the top cover 604 does not contact any of the traces 606

Figure 8:
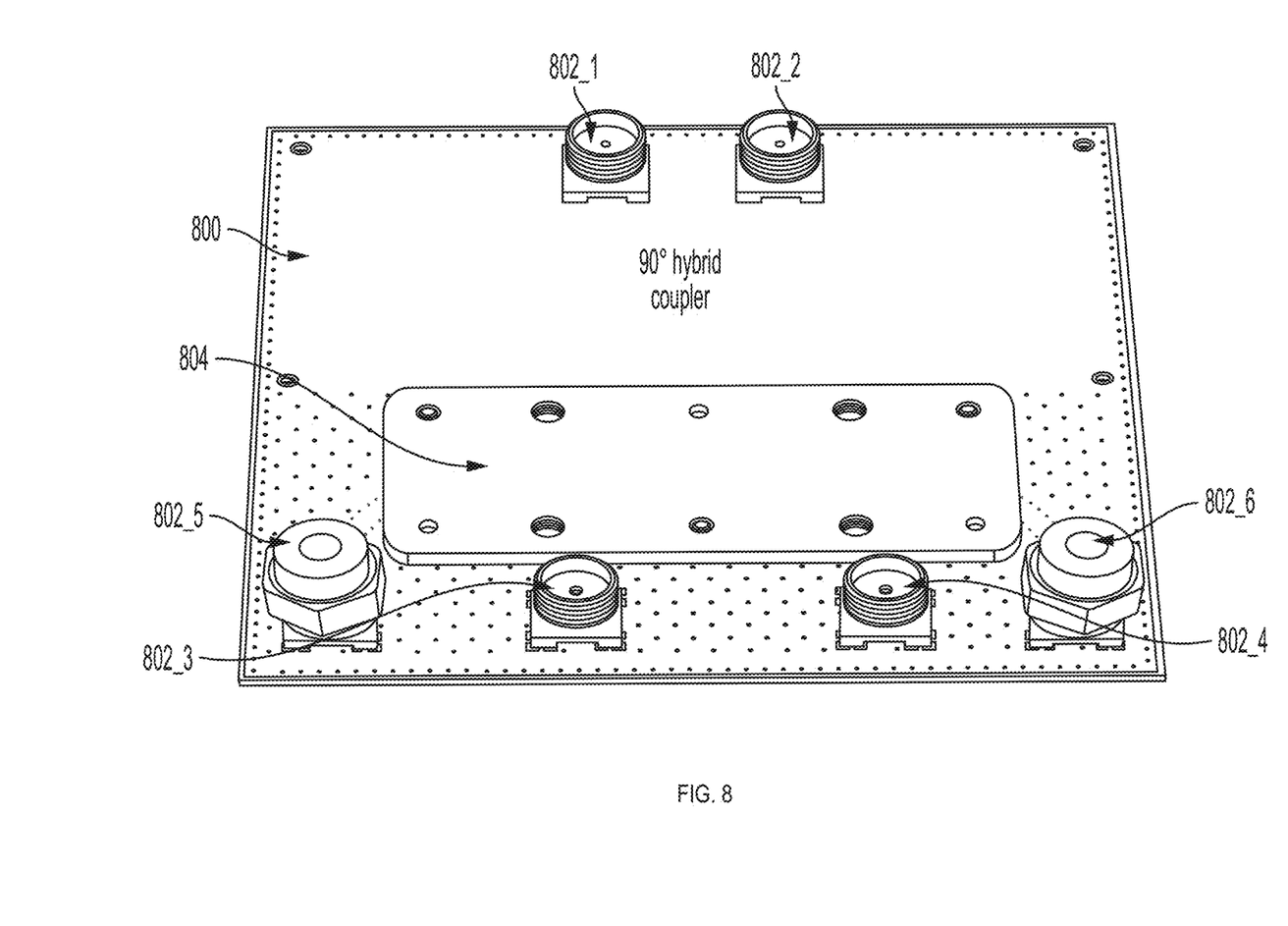
FIG. 8 depicts top view of a printed circuit board (PCB) integrated with two Josephson amplifiers or Josephson mixers according to one or more embodiments of the present invention.

FIG. 8 depicts top view of a printed circuit board integrated with two Josephson amplifiers or Josephson mixers according to one or more embodiments of the present invention. The circuit diagram of this PCB-integrated Josephson device is shown in FIGS. 1 and 2. The printed circuit board 800 includes the components of the Josephson amplifier or Josephson mixer 102_1, 1022, the hybrid coupler 104, Pump 1, Pump 2, and the other various components found in FIGS. 1 and 2. The PCB 800 includes six connectors (802_1 to 802_6). The six connectors (802_1 to 802_6) can be any type of connector including but not limited to SMA, SSMA, SMB, SMP, and the like. The six connectors can also be high-density connectors that connect to high-density traces on the PCB 800. Each of the six connectors (802_1 to 802_6) are coupled to different ports from the Josephson amplifiers or Josephson mixers 102_1 and 102_2 and the hybrid coupler 104 of FIGS. 1 and 2. Connector 802_1 is coupled to Port 1 of the hybrid coupler 104. Connector 802_2 is coupled to Port 2 of the hybrid coupler 104. Connector 802_3 is coupled to the input port of Pump 1 of 102_1 and connector 802_4 is coupled to Pump 2 of 102_2. Connector 802_5 is coupled to port b1_1 of 102_1 and connector 802_6 is coupled to port b2_2 of 102_2. The six connectors (802_1 to 802_6) can be coupled to their respective ports utilizing any combination of traces and vias formed on one or more layers of the PCB 800. An internal layer of the PCB 800 includes a hybrid coupler formed on the internal layer and connected to the connectors 802_1 and 802_2 utilizing any combination of traces and vias. Additionally, the first and the second leg of the hybrid coupler 104 (e.g., output ports) can be coupled to the input ports a1_1 and a2_1 of Josephson amplifiers or Josephson mixers 102_1 and 1022, respectively, utilizing any combination of traces and vias across one or more layers of the PCB 800. The PCB 800 includes a top cover 804 can mount/enclose the Josephson amplifiers or Josephson mixers 102_1 and 1022 integrated within the PCB 800. The top cover 804 can be a high-thermal-conductivity package attached to the PCB 800 such as, for example, an oxygen-free-high-conductivity (OFHC) copper and gold.

In one or more embodiments, the printed circuit boards described herein can be arranged to form an array (or arrays) of Josephson amplifiers or Josephson mixers that are separate from each other (have their own input and output connectors) or coupled together to form other Josephson devices. The array can be in a regular or irregular pattern. The circuit boards can route signals, such as microwave signals, between Josephson amplifiers or Josephson mixers or other microwave components integrated in the PCB or PCBs including quantum processors. The PCBs include one or more metallic and/or dielectric layers. The dielectrics can be low-loss, dielectric substrates. The metallic layers can include low-loss, normal metal or superconducting materials. The connectors described herein can be surface mount microwave connectors for input/output or high-density microwave connectors. The traces (i.e., transmission lines) in the PCBs can be in the form of microstrip, stripline, coplanar waveguide, and coupled stripline, for example.

In one or more embodiments of the present invention, the PCBs described herein can have more than two Josephson amplifiers or Josephson mixers integrated in the PCB. The Josephson amplifiers or Josephson mixers integrated in the PCBs can be housed in high-conductivity packages attached to the PCB. The PCBs with the integrated Josephson amplifiers or Josephson mixers can be utilized to form more sophisticated microwave circuits needed for scaling up quantum processor such as, for example, quantum-limited amplifiers, circulators, isolators, and switches.

In one or more embodiments, the PCB metallic layers can be any of copper, gold, silver, aluminum, and indium, for example. The PCBs can also be substituted with printed wiring boards, organic substrates, and similar substrates that support flip-chip technology, in which the pads of the chip are connected to the substrate through bump bonds or bump solder.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of +8% or 5%, or 2% of a given value.

As previously noted herein, for the sake of brevity, conventional techniques related to superconducting device and integrated circuit (IC) fabrication may or may not be described in detail herein. By way of background, however, a more general description of the superconducting device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a superconducting over a dielectric (e.g., silicon) substrate, some of which are described in the immediately following paragraphs.

In general, the various processes used to form a microchip that will be packaged into an IC fall into general categories, including, film deposition, removal/etching, and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Films of both conductors (e.g., poly-silicon, aluminum, copper, etc.) and insulators (e.g., various forms of silicon dioxide, silicon nitride, etc.) are used to connect and isolate components. Lithography is the formation of three-dimensional relief images or patterns on the semiconductor substrate for subsequent transfer of the pattern to the substrate. In lithography, the patterns are formed by a light sensitive polymer called a photo-resist. To build the complex structures of a circuit, lithography and etch pattern transfer steps are repeated multiple times. Each pattern being printed on the wafer is aligned to the previously formed patterns and slowly the conductors, insulators and other regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A printed circuit board (PCB) comprising:
   a dielectric substrate; and
   a first chip cavity and a second chip cavity formed within the dielectric substrate, wherein a first Josephson amplifier or Josephson mixer is disposed within the first chip cavity and a second Josephson amplifier or Josephson mixer is disposed within the second chip cavity;
      wherein each of the Josephson amplifiers or Josephson mixers comprises at least one port, each port electronically coupled to at least one connector; and
   wherein each of the at least one connector is disposed on the dielectric substrate.

2. The printed circuit board of claim 1, wherein a circuit trace is formed on first metallic surface of the dielectric substrate and a second metallic surface of the dielectric substrate.

3. The printed circuit board of claim 2, further comprising:
   one or more vias connecting the circuit traces printed on first surface and the second surface of the dielectric substrate.

4. The printed circuit board of claim 2, further comprising:
   a first cover and a second cover;
      the first cover operable to mount the first Josephson amplifiers or Josephson mixers and the second Josephson amplifiers or Josephson mixers, wherein the first cover is disposed on the first surface of the dielectric substrate; and
      the second cover operable to enclose the first nondegenerate device and the second nondegenerate device, wherein the second cover is disposed on the second surface of the dielectric substrate;
   wherein the first surface and the second surface are on opposing sides of the dielectric substrate.

5. The printed circuit board of claim 1, wherein the first Josephson amplifier or Josephson mixer is electronically coupled to the second Josephson amplifier or Josephson mixer.

* * * * *